United States Patent
Liu et al.

(10) Patent No.: US 12,549,192 B2
(45) Date of Patent: Feb. 10, 2026

(54) SYSTEM AND METHOD FOR PERFORMING ADAPTIVE VOLTAGE SCALING (AVS) FOR ANALOG-TO-DIGITAL CONVERTERS (ADCS)

(71) Applicant: Avago Technologies International Sales Pte. Limited, Singapore (SG)

(72) Inventors: Chang Liu, Irvine, CA (US); Boyu Hu, Irvine, CA (US); Xiaoliang Li, Irvine, CA (US); Delong Cui, Tustin, CA (US); Jun Cao, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 172 days.

(21) Appl. No.: 18/497,605

(22) Filed: Oct. 30, 2023

(65) Prior Publication Data
US 2025/0141464 A1    May 1, 2025

(51) Int. Cl.
*H03M 1/38*    (2006.01)
*H03M 1/44*    (2006.01)

(52) U.S. Cl.
CPC .................... *H03M 1/44* (2013.01)

(58) Field of Classification Search
CPC ........ H03M 1/44; H03M 1/002; H03M 1/462; H03M 1/1215; H03M 1/125; H03M 9/00; G06F 1/3296
USPC ................................. 341/155, 161
See application file for complete search history.

(56) References Cited

U.S. PATENT DOCUMENTS

| | | | |
|---|---|---|---|
| 2017/0195068 A1* | 7/2017 | Cho | H04B 17/13 |
| 2018/0364861 A1* | 12/2018 | Gray | G06F 3/04166 |
| 2020/0381947 A1* | 12/2020 | Bhandarkar | H02M 3/1582 |

OTHER PUBLICATIONS

Ben Keller, et al, "Sub-microsecond Adaptive Voltage Scaling in a 28nm FD-SOI Processor SoC" IEEE European Solid-StateCircuits Conference. pp. 269-272 2016.
Z. Guo, et al, "A 112.5Gb/s ADC-DSP-Based PAM-4 Long-Reach Transceiver with >50dB Channel Loss in 5nm FinFET" IEEESolid-State Circuits Conference, pp. 116-118, 2022.
Extended European Search Report on AppIn. No.24205199.3 dated Apr. 2, 2025.

(Continued)

*Primary Examiner* — Jean B Jeanglaude
(74) *Attorney, Agent, or Firm* — Foley & Lardner LLP

(57) ABSTRACT

A system may include one or more receivers, circuitry, and a controller. Each of the one or more receivers may include a plurality of analog-to-digital converters (ADCs). Each ADC may measure a time relating to an analog-to-digital conversion by the ADC, compare the time with a threshold, and generate, based on a result of the comparing, a first signal. The circuitry may be coupled to the one or more receivers. The circuitry may receive the first signal from each ADC, determine, based at least on the first signal, characteristics of performance of each receiver, and output a plurality of second signals. Each of the plurality of second signals may indicate the characteristics of performance of a corresponding receiver. The controller may be coupled to the circuitry and adjust a voltage provided to the one or more receivers, based at least on the plurality of second signals received from the circuitry.

19 Claims, 8 Drawing Sheets

(56) References Cited

OTHER PUBLICATIONS

John W. Poulton et al. " A1.17-pJ/b, 25-GB/s/pin Ground-Referenced Single-Ended Serial Link for Off-and On-Package Communication Using a Process-and Temperature-Adaptive Voltage Regulator", IEEE Journal of Solid-State Circuits, vol. 54, No. 1, Jan. 2019, pp. 43-54.

Marc-Andre Lacroix et al. "A 60Gb/s PAM-4 ADC-DSP Transceiver in 7mm CMOS with SNR-Based Adaptive Power Scaling Achieving 6.9pJ/b at 32dB Loss" ISSCC, Session 6, Ultra-High-Speed Wireline, Feb. 17, 2019, pp. 114-115.

Yoshifumi Ikenaga et al. "A 27% Active-Power-Reduced 40-nm CMOS Multimedia SoC With Adaptive Voltage Scaling Using Distributed Universal Delay Lines", IEEE Journal of Solid-State Circuits, vol. 47, No. 4, Apr. 2012, pp. 832-840.

\* cited by examiner

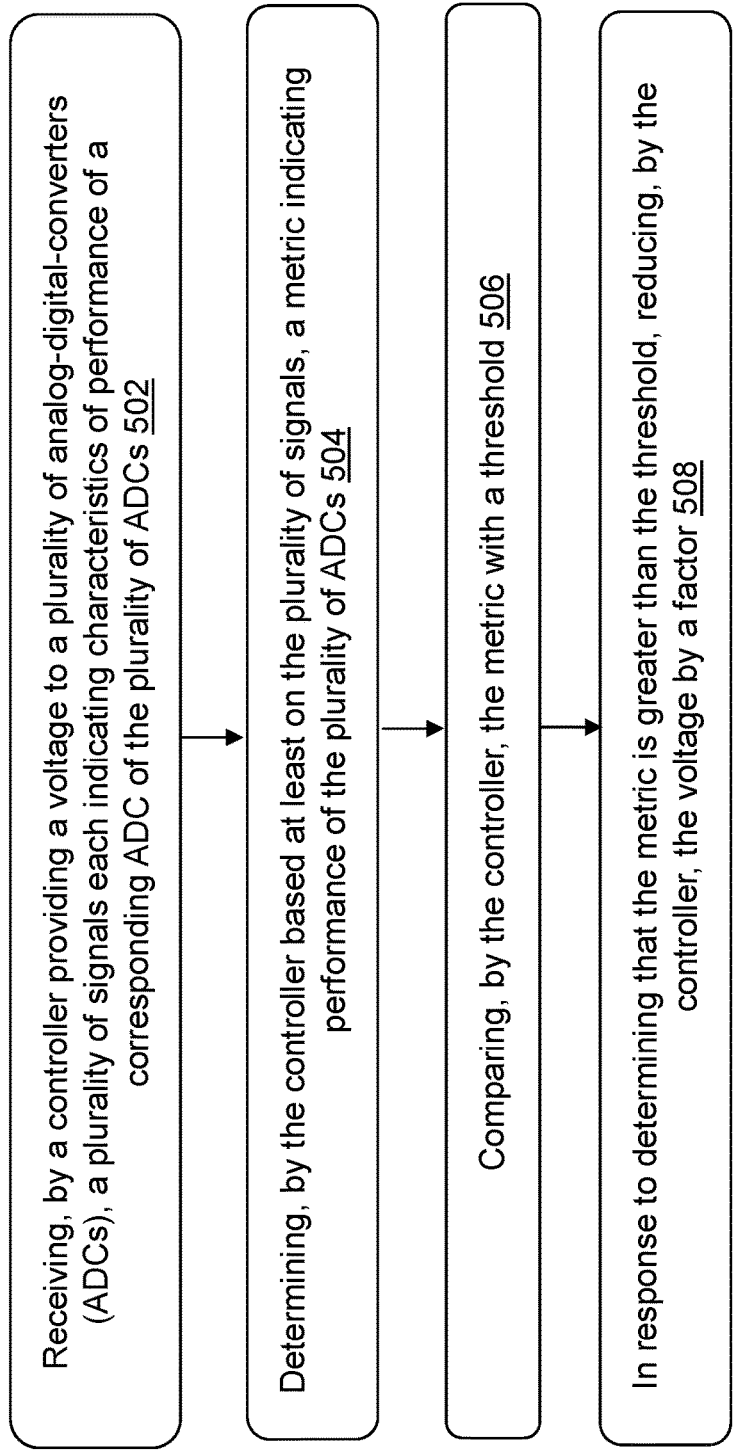

SYSTEM AND METHOD FOR PERFORMING ADAPTIVE VOLTAGE SCALING (AVS) FOR ANALOG-TO-DIGITAL CONVERTERS (ADCS)

FIELD OF THE DISCLOSURE

This disclosure generally relates to systems and methods for improving power efficiency of analog-to-digital converters (ADCs), and more particularly to performing an adaptive voltage scaling (AVS) for ADCs in an integrated circuit.

BACKGROUND

High-speed and/or high-resolution ADCs are used in a wide variety of applications in modern data communication systems, processing systems, and instrumentation/control systems, including but not limited to networking switch, serializer/deserializer (SerDes) physical layer (PHY), optical receiver, wireless base station receiver, data acquisition system, sensor, etc. For example, next generation networking switches can be implemented based on time-interleaved successive approximation register (SAR) ADCs. But, sometimes, high-speed and/or high-resolution ADCS in an integrated circuit, e.g., time-interleaved SAR ADCs used in high-speed data receivers in a switch chip, may consume a significant portion of the total power of the integrated circuit.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

FIG. 5 is a flow diagram showing another example process of performing AVS operations for ADCs, in accordance with an embodiment.

Figure 1A:
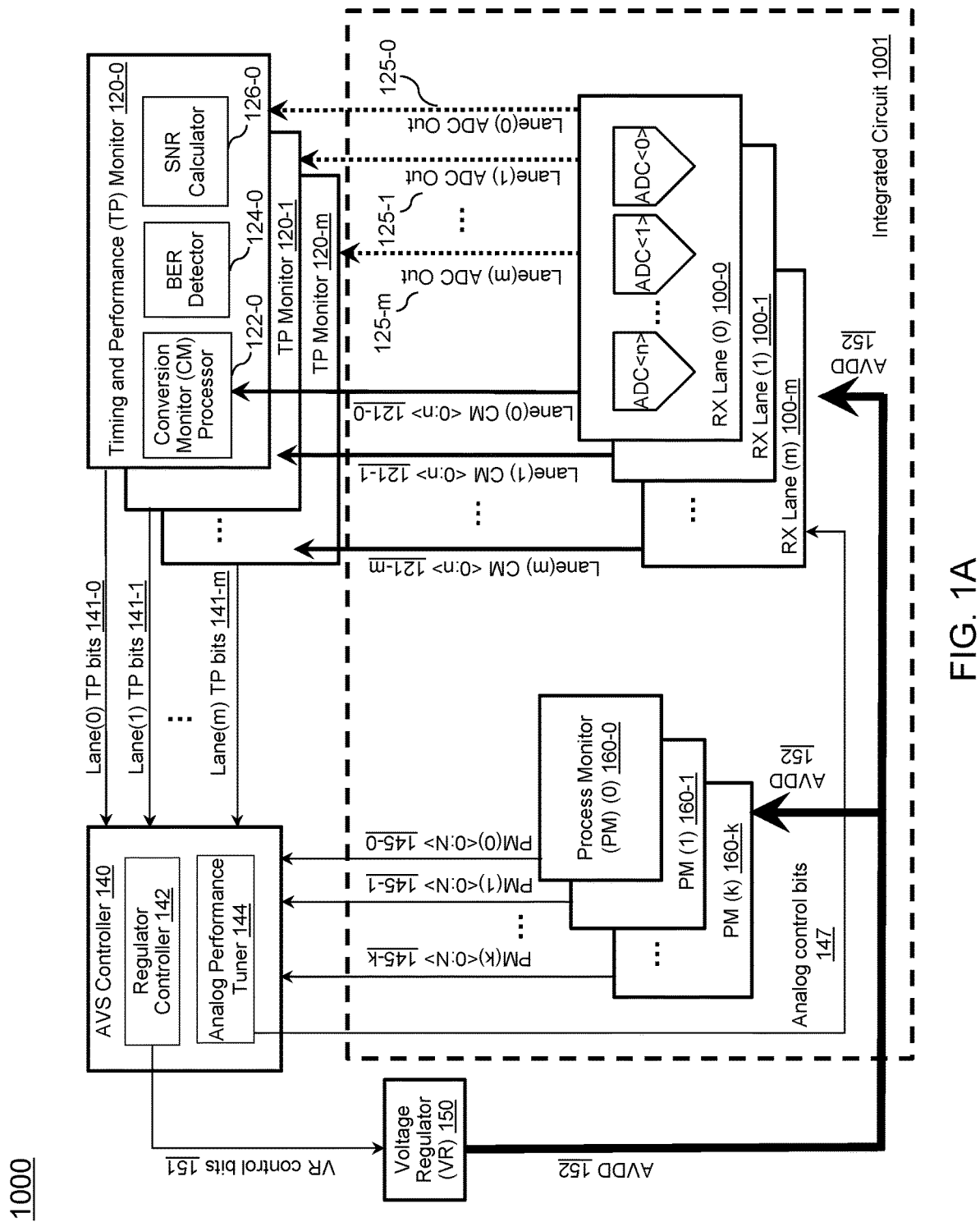
FIG. 1A to FIG. 1C are a schematic block diagram of an adaptive voltage scaling (AVS) system for analog-to-digital converters (ADCs), in accordance with an embodiment.

The details of various embodiments of the methods and systems are set forth in the accompanying drawings and the description below.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Various embodiments disclosed herein are related to a system including one or more receivers, circuitry, and a controller. In some embodiments, the circuitry may include (1) hardware, one or more processors (e.g., microprocessor) or a combination of hardware and/or one or more processors with software and/or firmware; or (2) a single component or a combination of multiple components. In some embodiments, the controller may be any circuit, hardware, processor (e.g., microprocessor), or a combination of a combination of hardware and/or one or more processors with software and/or firmware. Each of the one or more receivers may include a plurality of analog-to-digital converters (ADCs). Each ADC may measure a time relating to an analog-to-digital conversion by the ADC, compare the time with a threshold, and generate, based on a result of the comparing, a first signal. The circuitry may be coupled to the one or more receivers. The circuitry may receive the first signal from each ADC, determine, based at least on the first signal, characteristics of performance of each receiver, and output a plurality of second signals. Each of the plurality of second signals may indicate the characteristics of performance of a corresponding receiver. The controller may be coupled to the circuitry and adjust a voltage provided to the one or more receivers, based at least on the plurality of second signals received from the circuitry.

In some embodiments, each receiver may be a serializer/deserializer (SerDes) receiver. In some embodiments, the SerDes receiver may include one or more SerDes or one or more SerDes lanes that convert parallel data to serial data and vice versa for high speed data communication (e.g., high speed chip-to-chip communication). In some embodiments, the plurality of ADCs in each receiver include time-interleaved successive approximation register (SAR) ADCs. The threshold may be a clock interval between two SAR ADCs. In some embodiments, the characteristics of performance of each receiver include at least one of conversion timing of ADCs in the receiver, signal-to-noise ratio (SNR), or bit-error-rate (BER; e.g., the quantity of bits received divided by the total number of bits transmitted within the same time period). In some embodiments, the conversion timing of the ADCs may be an amount of time or a margin of time it takes between when a conversion of a sample of an analog signal completes and a next sample of the analog signal. In some embodiments, the conversion timing of the ADCs may be an amount of time it takes for an ADC to perform an analog to digital conversion (e.g., an average amount of time across all the ADCs or an amount of time it takes for each ADC to perform an analog-to-digital conversion).

In some embodiments, the voltage may be provided to one or more circuits. The system may further include second circuitry coupled to the one or more circuits. The second circuitry may be configured to measure, from the one or more circuits, at least one of standard cell delay, leakage current, or resistance and capacitance of metal patterns. In some embodiments, the standard cell delay of a circuit or one or more elements thereof may be a delay measured by circuitry (e.g., a ring oscillator) that is implemented with one or more standard cells that are selected or chosen to match the delay of the circuit or the one or more elements of the circuit. In some embodiment, the leakage current of a circuit or one or more elements thereof may be any current any current that flows from and/or the circuit or the one or more elements thereof when the ideal current is zero. In some embodiment, resistance and capacitance of metal patterns of a circuit may be resistance and/or capacitance of one or more metal patterns (e.g., metal, wiring, via, etc.) inside the circuit. The second circuitry may be configured to output, based on a result of the measuring, one or more third signals corresponding to the one or more circuits. The controller may be further configured to adjust the voltage provided to the one or more receivers, based at least on the plurality of second signals and the one or more third signals.

Various embodiments disclosed herein are related to a method. The method includes receiving, by a controller providing a voltage to a plurality of analog-to-digital-converters (ADCs), a plurality of signals each indicating characteristics of performance of a corresponding ADC of the plurality of ADCs. The method may include determining, by the controller based at least on the plurality of signals, a metric indicating performance of the plurality of ADCs. The method may include comparing, by the controller, the metric with a threshold. The method may include in response to determining that the metric is greater than the threshold, reducing, by the controller, the voltage by a factor.

In some embodiments, in response to determining that the metric is smaller than or equal to the threshold, the controller may increase the voltage by an offset. In some embodiments, before receiving the plurality of signals, the controller may set the voltage to a first voltage, and a voltage regulator may provide the first voltage to the plurality of ADCs. After reducing the voltage by the factor, the voltage regulator may provide the reduced voltage to the plurality of ADCs.

In some embodiments, a time relating to an analog-to-digital conversion by each ADC of the plurality of ADCs may be measured. The measured time may be compared with a second threshold. The plurality of signals may be generated based at least on a result of the comparing.

In some embodiments, the voltage regulator may provide the voltage to one or more circuits. At least one of standard cell delay, leakage current, or resistance and capacitance of metal patterns may be measured from one or more circuits. One or more signals corresponding to the one or more circuits may be generated based on a result of the measuring. The metric may be determined based on the plurality of signals and the one or more signals.

In some embodiments, after reducing the voltage by the factor, a second metric indicating performance of the plurality of ADCs may be adjusted based on the reduced voltage. The second metric may be different from the metric. In some embodiments, after reducing the voltage by the factor, a second plurality of signals each indicating characteristics of performance of a corresponding ADC of the plurality of ADCs may be received.

Various embodiments disclosed herein are related to circuitry including a first circuit and a second circuit. The first circuit may be coupled to a plurality of analog-to-digital converters (ADCs). The first circuit may be configured to measure a time relating to an analog-to-digital conversion by each ADC of the plurality of ADCs. The first circuit may be configured to compare the measured time with a threshold. The first circuit may be configured to generate, based at least on a result of the comparing, a plurality of first signals corresponding to the plurality of ADCs. The first circuit may be configured to determine, based at least on the plurality of first signals, characteristics of performance of the plurality of ADCs. The first circuit may be configured to output a second signal indicating the characteristics of performance of the plurality of ADCs. The second circuit may be coupled to the first circuit. The second circuit may be configured to adjust a voltage provided to the plurality of ADCs, based at least on the second signal received from the first circuit.

In some embodiments, the plurality of ADCs may include time-interleaved successive approximation register (SAR) ADCs. The threshold may be a clock interval between two SAR ADCs.

In some embodiments, the plurality of ADCs may form a receiver. The characteristics of performance may include at least one of conversion timing of the plurality of ADCs in the receiver, signal-to-noise ratio (SNR) of the receiver, or bit-error-rate (BER) of the receiver.

In some embodiments, the voltage may be provided to one or more circuits. The circuitry may further include a third circuit coupled to the one or more circuits. The third circuit may be configured to measure, from the one or more circuits, at least one of standard cell delay, leakage current, or resistance and capacitance of metal patterns. The third circuit may be configured to output, based on a result of the measuring, one or more third signals corresponding to the one or more circuits. The second circuit may be further configured to adjust the voltage provided to the plurality of ADCs, based at least on the second signal and the one or more third signals.

In one aspect, high-speed and/or high-resolution ADCs in an integrated circuit, e.g., time-interleaved SAR ADCs used in complementary metal-oxide semiconductor (CMOS) digital circuits or switch chips, may consume a significant portion of the total power of the integrated circuit. Adaptive voltage scaling (AVS) techniques have been adopted in latest networking switch chips to optimize the power and thermal performance of the complementary metal-oxide semiconductor (CMOS) digital circuits. AVS is a closed-loop dynamic power minimization technique that adjusts the voltage supplied to a computer chip to match the chip's power needs during operation. AVS may be the key technique enabling power reduction of a CMOS digital circuit based on the fact that the power dissipation of the CMOS digital circuit is proportional to $DVDD^2$, where DVDD (Digital Voltage Drain Drain) refers to a digital power supply voltage. Besides CMOS digital circuits, a switch chip may also integrate large amounts of SerDes cores which may consume significant portion of the total power of the switch chip. Therefore, AVS technique may be applicable to the SerDes Cores in order to further improve the power efficiency. Compared with AVS for CMOS digital circuits which uses a trade-off between speed and power, however, AVS for SerDes cores may be more complicated, because the SerDes core may include various analog signal blocks and/or mixed-signal blocks whose design targets and complexity are different from digital circuits. Therefore, a comprehensive timing and/or performance evaluation scheme specific to a system (e.g., SerDes system) may need to be designed or implemented for the AVS system.

Moreover, a SAR ADC may be a major building block in a SerDes core. SAR ADCs in a SerDes core may consumes one third of the total power of the SerDes core. SAR ADCs in a SerDes core may be a block suitable for applying the AVS technique because SAR ADCs resemble digital circuits in terms of delay sensitivity and/or power sensitivity to supply voltage and process variation. Digital circuits may use a process monitor (PM), which may contain multiple standard-cell based ring oscillators to monitor the circuit delay under process variations. Different from digital circuits, SAR ADCs may contain both analog components (e.g., comparator and capacitive digital-to-analog converter (CDAC)) and digital components (e.g., SAR logic circuit), both determining the conversion delay of the SAR ADCs. Specifically, the delay of the analog component may not only be a function of the process and power supply, but also of many other design parameters, including bias conditions, signal amplitudes, common-mode voltages, etc. Therefore, the standard-cell based PM may not be capable of characterizing or measuring the performance of the SAR ADCs.

Furthermore, as a mixed signal circuit, SAR ADCs may have many design specifications (or targets) besides speed and power, including noise, distortion and leakage, etc. The supply adaptation (e.g., VDD adaptation, AVS) may not only affect speed and power, but also other metrics (e.g., performance metrics), which can directly affect the system performance, including signal-to-noise ratio (SNR), or bit-error-rate (BER), etc. There is a need for AVS schemes that can be performed without significantly affecting the system performance.

To solve these problems, according to certain aspects, embodiments in the present disclosure relate to a technique to provide an AVS system for high-speed and/or high-resolution ADCs (e.g., SAR ADCs) in an integrated circuit (e.g., network switch chip). In some embodiments, an AVS system may closely monitor the system performance (e.g., timing, BER, SNR, etc.) so as to perform AVS without significantly affecting the system performance. In some embodiments, after adapting supply power or voltage, related analog design parameters may be tuned, adjusted, or regulated again to meet the design targets (e.g., speed and power, including noise, distortion and leakage etc.).

In some embodiments, an AVS system may include (1) a plurality of receivers (or receiver (RX) lanes), each including a plurality of ADCs, (2) a plurality of timing and performance (TP) monitors corresponding to the plurality of RX lanes, (3) a plurality of process monitors (PMs), (4) an AVS controller, and/or (5) a voltage regulator (VR; or voltage regulator circuit or voltage regulator module (VRM)). Each of the TP monitors may include a conversion monitor (CM) processor (or CM processing circuit), a BER detector (or BER detection circuit), and/or an SNR calculator (or SNR calculation circuit). The AVS controller may include a regulator controller and/or an analog performance tuner (or analog performance tuning circuit). In some embodiments, at least the plurality of RX lanes and the plurality of process monitors may be included in an integrated circuit (e.g., a networking switch chip).

In some embodiments, the plurality of RX lanes may be any circuit or hardware that is configured to receive a plurality of analog signals, respectively. In some embodiments, the plurality of RX lanes may SerDes lanes sharing the same supply voltage, e.g., analog supply voltage (AVDD). Each RX lane (or SerDes lane) may contain one time-interleaved SAR ADC including a plurality of SAR ADCs. The voltage regular may be controlled by the AVS controller to generate the AVDD voltage and deliver the voltage through a distributed power mesh to each RX lane (or SerDes lane).

In some embodiments, the AVS system may provide two categories of performance detection schemes from various monitors or monitor circuits (e.g., on-chip monitors). The first scheme may be using an embedded monitor (e.g., conversion timing monitor) within each RX lane. The second scheme may be using dedicated process monitors placed at several spots of the integrated circuit (e.g., switch chip), which provide the process information (e.g., process variation information) under an AVDD.

The plurality of ADCs in each RX lane may measure or monitor conversion timing of the plurality of ADCs, generate results of the measurement or monitoring as a combined ADC conversion monitoring (CM) signal corresponding to that RX lane, and provide the combined ADC CM signal to the corresponding TP monitor (e.g., the CM processor of the corresponding TP monitor). In some embodiments, the combined ADC CM signal may be a digital signal with a plurality of bits. Each RX lane may combine output signals of the plurality of ADCs thereof into a combined ADC output signal, and provide the combined ADC output signal to the corresponding TP monitor.

In some embodiments, the plurality of ADCs in each RX lane may be time-interleaved SAR ADCs. For example, each of the plurality of ADCs in each RX lane may be a time-interleaved SAR ADC. Each ADC of the plurality of ADCs may include a conversion (timing) monitor (or conversion monitoring circuit) configured to monitor conversion timing of that ADC (e.g., conversion timing margin) and generate a conversion monitoring (CM) signal of that ADC. In some embodiments, the CM signal of that ADC may be a 1-bit digital signal. The plurality of CM signals in each RX lane may be combined into the combined CM signal corresponding to that RX lane, and provided to the CM processor of the corresponding TP monitor. In some embodiments, the combined CM signal may include a plurality of CM bits received from the plurality of ADCs. Each ADC of the plurality of ADCs may be configured to generate an ADC output signal of that ADC. The plurality of ADC output signals in each RX lane may be combined into the combined ADC output signal corresponding to that RX lane, and provided to the corresponding TP monitor. In some embodiments, the combined ADC output signal may include the plurality of ADC output signals in each RX lane.

In some embodiments, the plurality of TP monitors may be any circuit or hardware or one or more microprocessors that are configured to measure or monitor timing and performance of the corresponding RX lanes. The CM processor of each TP monitor may generate, based on the combined conversion monitoring (CM) signal, one or more timing bits (corresponding to an RX lane). In some embodiments, the one or more timing bits may include the plurality of CM bits contained in the combined CM signal. In some embodiments, the one or more timing bits may indicate the number of 1's in the plurality of CM bits contained in the combined CM signal. In some embodiments, the one or more timing bits may be set such that the greater value the timing bits indicate, the more power the corresponding RX lane has consumed and/or the more noise the corresponding RX lane has produced.

In some embodiments, the BER detector of each TP monitor may generate, based on the combined ADC output signal, one or more BER bits (corresponding to the RX lane). In some embodiments, the BER detector may calculate a BER (corresponding to the RX lane) using the combined ADC output signal and an input signal of pseudo-random bit sequences (PRBSs), and set the one or more BER bits based on the calculate BER. In some embodiments, the one or more BER bits may indicate the calculated BER (corresponding to the RX lane). In some embodiments, the one or more BER bits may be set such that the greater value the BER bits indicate, the more noise the corresponding RX lane has produced.

In some embodiments, the SNR calculator of each TP monitor may generate, based on the combined ADC output signal, one or more SNR bits (corresponding to the RX lane). In some embodiments, the SNR detector may calculate an SNR (corresponding to the RX lane) after performing equalization of the combined ADC output signal, and set the one or more SNR bits based on the calculate SNR. In some embodiments, the one or more SNR bits may indicate the calculated SNR (corresponding to the RX lane). In some embodiments, the one or more SNR bits may be set such that the greater value the SNR bits indicate, the more noise the corresponding RX lane has produced. Each TP monitor may combine the one or more timing bits, the one or more BER bits, and/or the one or more SNR bits to provide a set of TP bits (corresponding to the RX lane) to the AVS controller.

In some embodiments, the plurality of process monitors may be any be any circuit or hardware or one or more microprocessors that are configured to measure or monitor process variation of one or more circuits. For example, each process monitor may measure or monitor at least one of delay (e.g., delay measured by an oscillation frequency of a standard cell-based ring oscillator), leakage current, resistance, or capacitance of one or more circuits under the same power domain (e.g., under the same AVDD power domain). Each process monitor may combine results of the measurements or the monitoring to provide a set of PM bits to the AVS controller.

In some embodiments, each process monitor may include a frequency monitor (or frequency monitoring circuit), a leakage monitor (or leakage monitoring circuit), and/or a metal resistance and capacitance (RC) monitor (or metal RC monitoring circuit). In some embodiments, the frequency monitor may measure various types of standard cell delay. In some embodiments, the leakage monitor may measure leakage current of one or more transistors (e.g., NMOS, PMOS). In some embodiments, the metal RC monitor may resistance and/or capacitance of designed metal patterns (e.g., metal, wiring, via, etc.).

In some embodiments, each process monitor may generate, based on outputs of the frequency monitor, the leakage monitor and/or the metal RC monitor, a combined process monitoring (PM) signal, and provide the combined PM signal to the AVS controller. In some embodiments, the combined PM signal may be a digital signal with a plurality of bits. The combined PM signal may include one or more frequency monitor (FM) bits, one or more leakage monitor (LM) bits, and/or one or more metal resistance and capacitance monitor (MRC) bits.

In some embodiments, the one or more FM bits (among the set of PM bits) may indicate a delay of one or more circuits. In some embodiments, the one or more FM bits may be set such that the greater value the FM bits indicate, the more power the one or more circuits have consumed and/or the more noise the one or more circuits have produced. In some embodiments, the one or more LM bits (among the set of PM bits) may indicate an amount of leakage current of one or more circuits. In some embodiments, the one or more LM bits may be set such that the greater value the LM bits indicate, the more power the one or more circuits have consumed and/or the more noise the one or more circuits have produced. In some embodiments, the one or more MRC bits (among the set of PM bits) may indicate a value of resistance/capacitance (RC) of one or more metal patterns. In some embodiments, the one or more MRC bits may be set such that the greater value the MRC bits indicate, the more power the one or more circuits have consumed and/or the more noise the one or more circuits have produced.

In some embodiments, the AVS controller may be any circuit or hardware or one or more microprocessors that are configured to control and/or perform AVS operations. The regulator controller of the AVS controller may generate, based on the plurality of sets of TP bits and/or the plurality of sets of PM bits, one or more voltage regulator (VR) control bits, and provide the generated one or more VR control bits to the voltage regulator. In some embodiments, the voltage regulator may control a supply voltage (e.g., AVDD) based on the one or more VR control bits. The analog performance tuner of the AVS controller may generate, based on the plurality of sets of TP bits and/or the plurality of sets of PM bits, one or more analog control bits, and provide the generated one or more analog control bits to the plurality of RX lanes (and ADCs therein). In some embodiments, the ADCs in the plurality of RX lanes may tune or adjust analog design parameters based on the one or more analog control bits. The analog design parameters may include, but not limited to, comparator bias current, input common mode voltage, programmable delay, etc.

In some embodiments, the voltage regulator may be any circuit or hardware that is configured to generate and/or regulate a supply voltage (e.g., AVDD (Analog Voltage Drain Drain)) such that the supply voltage is maintained constant, and provide the regulated supply voltage to a plurality of circuits including the plurality of process monitors and the plurality of RX lanes. The voltage regulator may generate, based on the VR control bits, an AVDD, and provide the generated AVDD to the plurality of circuits.

In some embodiments, a conversion (timing) monitor of each ADC of the plurality of ADCs (e.g., each SAR ADC) may include a DAC, a SAR logic circuit, a comparator (or comparator circuit), a plurality of shift registers that are serially connected, a conversion done logic (or conversion done logic circuit), a multiplexer, and an output register configured to output a signal representing a CM bit. The DAC may be a capacitive DAC (CDAC) or any DAC that can convert a digital signal to an analog signal responsive to a data input signal. The comparator may be a differential amplifier, e.g., operational amplifier. The comparator may receive the analog signal output from the DAC and an input analog signal, compare the two signals, and output a signal indicating a result of the comparison. The SAR logic circuit may be configured to receive a sampling clock, sequentially determine a value of each digital bit of the digital signal (e.g., 6 bits digital signal) based on the output signal of the comparator, and provide a clock (e.g., asynchronous clock) to the comparator. The plurality of shift registers may count the number of conversion steps. The conversion done logic may receive the sampling clock and an output from the last shift register and output a conversion done signal which indicates whether the conversion of the input analog signal completes.

In some embodiments, the SAR logic circuit may be an asynchronous SAR logic circuit that does not use an internal clock while still using a sample clock for uniform sampling of the analog signal. With the asynchronous SAR logic, the execution time for each of conversion steps of a conversion may not be fixed and/or uniform. Instead, after each of the conversion steps completes, the next step in the conversion can begin without a substantial delay in between.

In some embodiments, the multiplexer may receive a plurality of sampling clocks of other ADC units, and output a threshold signal indicating a threshold interval, according to a selection signal. In some embodiments, the threshold interval may be defined as a clock interval between two unit ADCs. The threshold interval may be programmable by choosing among different clock phases. If the selection signal indicates two sampling clocks out of the plurality of sampling clocks, the multiplexer may output a threshold signal indicating a threshold interval that is a clock interval between the two sampling clocks. The output register may receive a conversion done signal from the conversion done logic and a threshold signal from the multiplexer, and output a signal representing a CM bit. A margin of time between when a conversion of a sample of an analog signal completes and a next sample of the analog signal is taken (e.g. tracked and held) can be referred to as the "conversion time margin," "conversion timing margin," or "conversion margin." The conversion margin can be a measure of performance of a SAR ADC (e.g., asynchronous SAR ADC) in terms of speed. For example, a SAR conversion margin may be a good indicator for the SAR ADC conversion speed compared to design specifications (or targets). In general, the existence or long period of a conversion margin indicates that an asynchronous SAR ADC is overperforming in terms of conversion speed and, as a result, consuming more power and/or producing more noise than necessary. In some embodiments, the conversion margin may be determined based on the conversion done signal and the next sampling clock. In some embodiments, the output register may set the CM bit to "1" when the conversion margin is greater than the threshold interval (thus consuming more power and/or producing more noise), and set the CM bit to "0" when the conversion margin is smaller than or equal to the threshold interval.

For example, in a timing diagram showing a sampling clock and a conversion done signal, after an analog signal is sampled in a sampling phase, a process of conversion steps may be performed asynchronously (in an asynchronous conversion phase). Responsive to completion of the conversion process, the conversion done signal may be "on" (e.g., switched to a high level), which defines a conversion margin (or conversion time margin) between the time when the conversion done signal becomes "on" and the start of the next sampling phase. If the conversion margin is smaller than a threshold interval, the multiplexer may output a threshold signal before the conversion done signal is on, and the output register may set the CM bit to "0". On the other hand, if the conversion margin is greater than a threshold interval, the multiplexer may output a threshold signal after the conversion done signal is on, and the output register may set the CM bit to "1". For best characterization of the ADC speed of an integrated circuit (e.g., the speed of SAR ADCs in the whole switch chip), CM bits may be collected by obtaining multiple samples from each unit ADC (e.g., unit SAR ADC) across all the RX lanes. In this manner, the AVS system can capture (1) data-dependent delay variation and/or (2) local or global process variability-induced delay variation.

In some embodiments, a frequency monitor (or frequency monitoring circuit) may include a NAND-gate based ring oscillator, a divider (or divider circuit), and/or a counter (or counter circuit). The ring oscillator may include a plurality of NAND gates (e.g., an odd number of NAND gates). The frequency monitor may measure a delay of selected one or more standard cells under an analog power supply (e.g., AVDD). In some embodiments, the ring oscillator may be implemented with one or more standard cells that are selected or chosen to match the delay of a critical path in ADCs (for example, a critical path including digital elements inside a SAR ADC). The divider may divide a clock output from the ring oscillator to relax a timing requirement for the counter. The counter may receive the divided clock output from the divider, calculate (or count) an oscillation frequency value based on the divided clock according a reference clock, and store the oscillation frequency value in a register. For example, the divider may divide the ring oscillator output clock into a low frequency clock. The counter may be driven by the reference clock and sample the incoming divided clock. The frequency of the reference clock is higher than the frequency of the divided clock. The lower frequency of the divided clock helps to reduce the frequency of the reference clock so that the timing requirement for a sequential logic path is relaxed with the lower frequency clock.

In one approach, an AVS system may perform a process of AVS operations for multiple lanes of ADCs in an integrated circuit (e.g., multiple SerDes lanes of SAR ADCs in a switch chip). In some embodiments, the AVS system can run the process of AVS operations (e.g., calibration) in foreground and/or background. For example, a foreground calibration is a one-time calibration with specific input training sequences. In the foreground calibration, it is difficult to process a normal data flow. A background calibration is a continuous calibration running together with a normal data flow. In some embodiments, monitors (e.g., TP monitors, process monitors, conversion monitors, frequency monitors, leakage monitors, metal RC monitors, etc.) can run in both background mode and foreground mode.

In some embodiments, at a first step, the AVS system (e.g., AVS controller, voltage regulator) may start AVS operations. At a second step, the voltage regulator may set or initialize a supply voltage (e.g., AVDD) to a default voltage without voltage scaling. In some embodiments, the regulator controller of the AVS controller may set the one or more VR control bits to "0" or any default value, and provide the VR control bits to the voltage regulator so that the voltage regulator can set the AVDD to the default voltage.

At a third step, the AVS controller may collect process information (e.g., the plurality of sets of PM bits). In some embodiments, the AVS controller may read, obtain, collect, or receive a set of PM bits from each process monitor. At a fourth step, the AVS controller may collect timing and performance (TP) information (e.g., the plurality of sets of TP bits). In some embodiments, the AVS controller may read, obtain, collect, or receive a set of TP bits from each TP monitor or from each RX lane.

At a fifth step, the AVS controller may calculate a performance metric P (e.g., SAR ADC performance metric) based on the process information (e.g., the plurality of sets of PM bits) and/or the TP information (e.g., the plurality of sets of TP bits). In some embodiments, the performance metric may be calculated based on one or more values indicated in the plurality of sets of PM bits and/or one or more values indicated in the plurality of sets of TP bits. In some embodiments, the performance metric may be calculated based on (1) values indicated by timing bits of the plurality of sets of TP bits, (2) values indicated by BER bits of the plurality of sets of TP bits, (3) values indicated by SNR bits of the plurality of sets of TP bits, (4) values indicated by FM bits of the plurality of sets of PM bits, (5) values indicated by LM bits of the plurality of sets of PM bits, and/or (6) values indicated by MRC bits of the plurality of sets of PM bits. In some embodiments, the performance metric may be calculated based on a sum (e.g., weighted sum) of (1) values indicated by timing bits of the plurality of sets of TP bits, (2) values indicated by BER bits of the plurality of sets of TP bits, (3) values indicated by SNR bits of the plurality of sets of TP bits, (4) values indicated by FM bits of the plurality of sets of PM bits, (5) values indicated by LM bits of the plurality of sets of PM bits, and/or (6) values indicated by MRC bits of the plurality of sets of PM bits. The performance metric may be calculated such that the greater the calculated performance metric is, the more power the plurality of RX lanes or the integrated circuit has consumed and/or the more noise the plurality of RX lanes or the integrated circuit has produced.

At a sixth step, the AVS controller may compare the calculated performance metric P with a target performance metric $P_{target}$. In some embodiments, the target performance metric $P_{target}$ may be experimentally (or by simulations) determined to indicate that power and/or noise that the plurality of RX lanes or the integrated circuit consume and/or produce satisfy predetermined design specifications (or targets).

At a seventh step, responsive to determining that the calculated performance metric P is greater than the target performance metric $P_{target}$, the AVS controller may reduce or scale down the AVDD by decreasing the value of the one or more VR control bits and providing the decreased value to the voltage regulator. In some embodiments, the AVS controller may decrease or reduce the value of the one or more VR control bits by a predetermined step value (e.g., 1).

At an eighth step, the AVS controller (e.g., analog performance tuner) may determine, tune, or adjust the one or more analog control bits based on the one or more VR control bits calculated at the seventh step (or the AVDD corresponding to the VR control bits). In some embodiments, the AVS controller may apply pre-trained or predetermined analog control bits to the ADCs in the plurality of RX lanes, based on the one or more VR control bits calculated at the seventh step. For example, the AVS controller may refer to a lookup table (LUT) stored in a memory and find, in the LUT, a value of analog control bits corresponding to the value of the one or more VR control bits (or the AVDD corresponding to the VR control bits). Then, the iteration may continue by going back to the third step.

At a ninth step, responsive to determining that the calculated performance metric P is smaller than or equal to the target performance metric $P_{target}$ (or the calculated performance metric P reaches the target performance metric $P_{target}$), the AVS controller may increase or scale up the AVDD by increasing the value of the one or more VR control bits and providing the increased value to the voltage regulator. In some embodiments, the AVS controller may increase (or back off) the value of the one or more VR control bits by a predetermined value (or an offset) so as to leave a margin for temperature drift and/or device aging.

Embodiments in the present disclosure have at least the following advantages and benefits. First, embodiments in the present disclosure can provide useful techniques for providing timing and performance monitoring circuits embedded in a plurality of SerDes lanes or a plurality of ADCs therein. Compared with traditional AVS schemes for digital circuits, the embedded timing and performance monitor (or monitoring circuit) can provide accurate and comprehensive information about the performance of key blocks of an integrated circuit (e.g., SAR ADCs, SerDes system in a switch chip) with minimum power and area overhead. Compared with traditional centralized process monitor architectures, the per-lane timing and performance monitor can capture local and global process variation across the whole integrated circuit (e.g., the whole switch chip).

Second, embodiments in the present disclosure can provide useful techniques for significantly reducing power consumed by ADCs (e.g., SAR ADCs) compared with ADC-based systems without AVS. For example, in a CMOS 3 nm 112G 7 bit SAR ADC system in accordance with some embodiments, the overall SAR ADC power can be reduced by up to 50%. For a SerDes core in a switch chip, a SAR ADC array may contribute to one third of the total power. The overall SerDes core power can be reduced by 15%~20% using an AVS scheme based on the embedded timing and performance monitors in accordance with some embodiments.

Third, embodiments in the present disclosure can provide useful techniques for achieving significant power reduction while maintaining high performance for a broad range of products involving time-interleaved ADC, for example, switch chips, optical links, SERDES PHY chips, etc. In other words, a broad range of products involving power-efficient and high-speed ADCs can be implemented using the AVS techniques according to some embodiments.

Figure 1B:
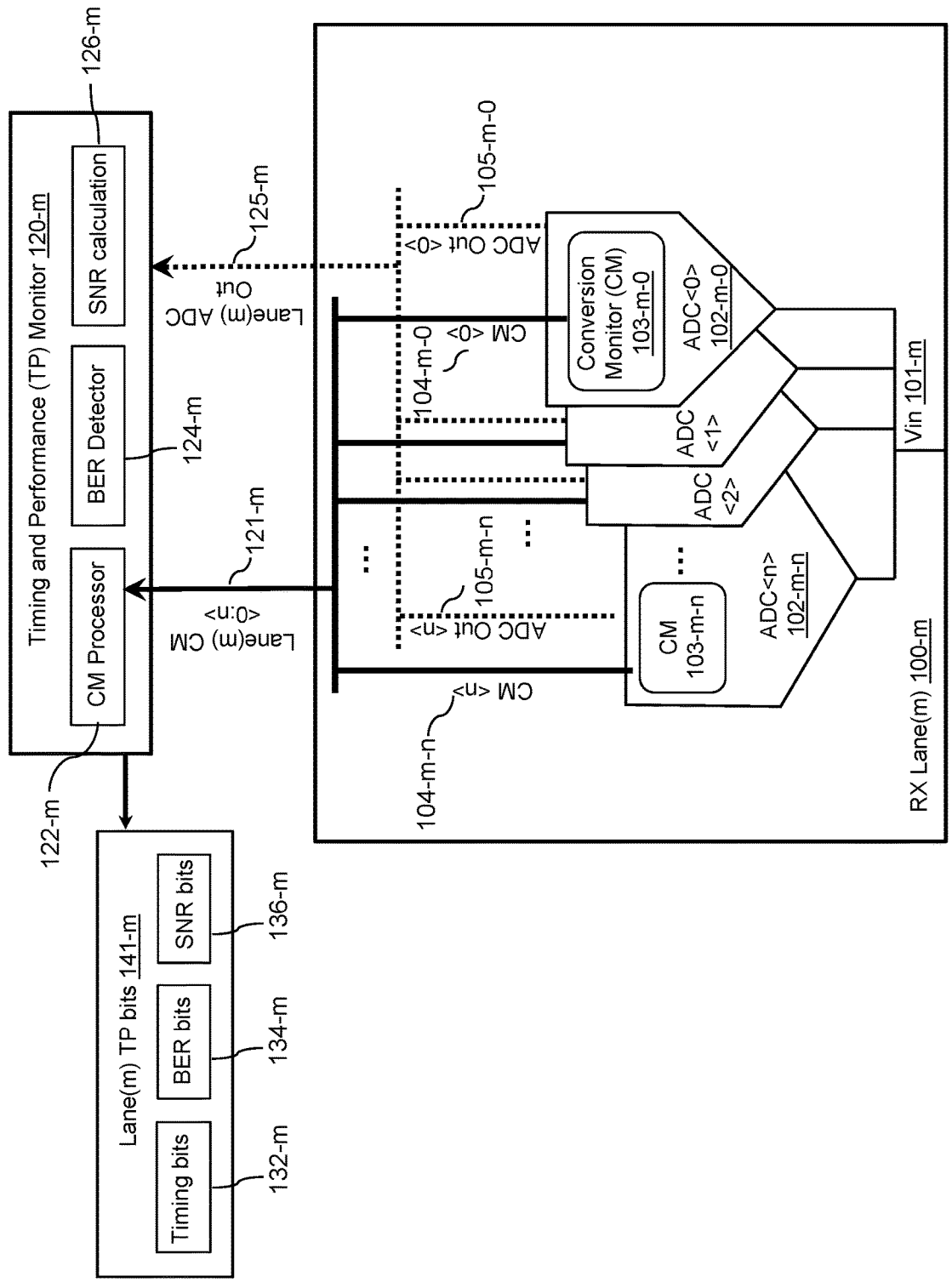
Figure 1C:
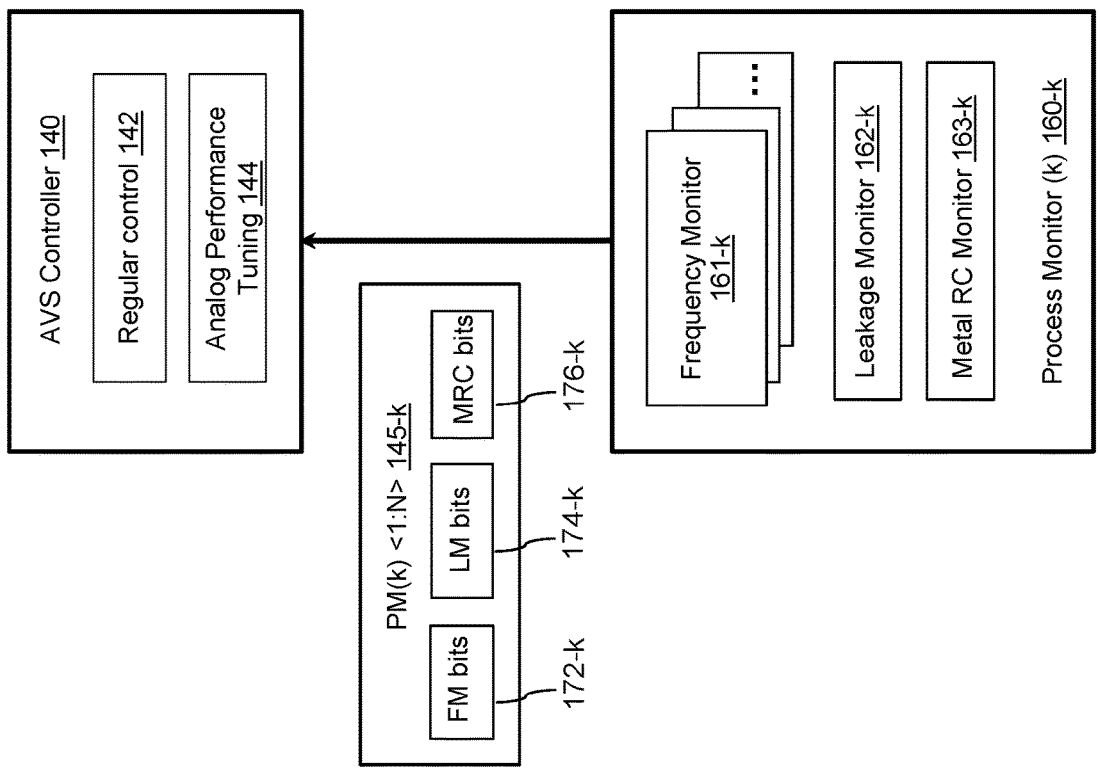

FIG. 1A to FIG. 1C are a schematic block diagram of an adaptive voltage scaling (AVS) system 1000 for analog-to-digital converters (ADCs), in accordance with an embodiment. The AVS 1000 system may include (1) a plurality of receivers (or receiver (RX) lanes 100-0, 100-1, . . . , 100-*m*; m is an integer greater than 0), each including a plurality of ADCs (e.g., (n+1) number of ADCs), (2) a plurality of timing and performance (TP) monitors 120-0, 120-1, . . . , 120-*m* corresponding to the plurality of RX lanes 100-0, 100-1, . . . , 100-*m*, (3) a plurality of process monitors (PMs) 160-0, 160-1, . . . , 160-*k* (k is an integer greater than 0), (4) an AVS controller 140, and/or (5) a voltage regulator 150 (VR; or voltage regulator circuit or voltage regulator module (VRM)). Each of the TP monitors (e.g., TP monitor 120-*m*) may include a conversion monitor (CM) processor (or CM processing circuit) 122-*m*, a BER detector (or BER detection circuit) 124-*m*, and/or an SNR calculator (or SNR calculation circuit) 126-*m*. The AVS controller 140 may include a regulator controller 142 and/or an analog performance tuner (or analog performance tuning circuit) 144. At least the plurality of RX lanes 100-0, . . . , 100-*m* and the plurality of process monitors 160-0, . . . , 160-*k* may be included in an integrated circuit 1001 (e.g., a networking switch chip).

Referring to FIG. 1A, the plurality of RX lanes 100-0, 100-1, . . . , 100-*m* may be any circuit or hardware that is configured to receive a plurality of analog signals, respectively. The plurality of RX lanes may SerDes lanes sharing the same supply voltage, e.g., analog supply voltage (AVDD). Each RX lane (or SerDes lane) may contain one time-interleaved SAR ADC including a plurality of SAR ADCs. The voltage regular 150 may be controlled by the AVS controller 140 to generate the AVDD voltage 152 and deliver the voltage 152 through a distributed power mesh (not shown) to each RX lane (or SerDes lane) 100-0, 100-1, . . . , 100-*m*.

Referring to FIG. 1A, the AVS system 1000 may provide two categories of performance detection schemes from various monitors or monitor circuits (e.g., on-chip monitors). The first scheme may be using an embedded monitor (e.g., conversion (timing) monitor shown in FIG. 1B) within each RX lane 100-0, 100-1, . . . , 100-*m*. The second scheme may be using dedicated process monitors 160-0, 160-1, . . . , 160-*k* placed at several spots of the integrated circuit 1001 (e.g., switch chip), which provide the process information (e.g., process variation information) under an AVDD 152.

Referring to FIG. 1A and FIG. 1B, the plurality of ADCs in each RX lane (e.g., (n+1) number of ADCs 102-*m*-0, 102-*m*-1, . . . , 102-*m*-*n* in the RX lane 100-*m*) may measure or monitor conversion timing of the plurality of ADCs, generate results of the measurement or monitoring as a combined ADC conversion monitoring (CM) signal 121-*m* corresponding to that RX lane 100-*m*, and provide the combined ADC CM signal 121-*m* to the corresponding TP monitor (e.g., the CM processor 122-*m* of the corresponding TP monitor 120-*m*). The combined ADC CM signal 121-*m* may be a digital signal with a plurality of bits (e.g., (n+1) number of bits <0:n>). Each RX lane (e.g., RX lane 100-*m*) may combine output signals of the plurality of ADCs thereof (e.g., ADC out <0> 105-*m*-0, . . . , ADC Out <n> 105-*m*-*n*) into a combined ADC output signal 125-*m*, and provide the combined ADC output signal 125-*m* to the corresponding TP monitor 120-*m*.

Referring to FIG. 1B, the plurality of ADCs 102-*m*-0, 102-*m*-1, . . . , 102-*m*-*n* in each RX lane (e.g., RX lane 100-*m*) may be a time-interleaved SAR ADC. Each ADC of the plurality of ADCs 102-*m*-0, 102-*m*-1, . . . , 102-*m*-*n* may include a conversion (timing) monitor (or conversion monitoring circuit) 103-*m*-0, 103-*m*-1, . . . , 103-*m*-*n*, configured to monitor conversion timing of that ADC (e.g., conversion timing margin) and generate a conversion monitoring (CM) signal of that ADC (e.g., CM<0> 104-*m*-0, CM<1> 104-*m*-1, . . . , CM<n> 104-*m*-*n*). The CM signal of that ADC may be a 1-bit digital signal (referred to as "CM bit"). The plurality of CM signals CM<0> 104-*m*-0, CM<1> 104-*m*-1, . . . , CM<n> 104-*m*-*n* in each RX lane (e.g., RX lane 100-*m*) may be combined into the combined CM signal 121-*m* corresponding to that RX lane (e.g., RX lane 100-*m*), and provided to the CM processor 122-*m* of the corresponding TP monitor 120-*m*. The combined CM signal 121-*m* may include a plurality of CM bits CM<0> 104-*m*-0, CM<1> 104-*m*-1, . . . , CM<n> 104-*m*-*n* received from the plurality of ADCs. Each ADC of the plurality of ADCs may be configured to generate an ADC output signal of that ADC. The plurality of ADC output signals ADC out <0> 105-*m*-0, . . . , ADC Out <n> 105-*m*-*n* in each RX lane (e.g., RX lane 100-*m*) may be combined into the combined ADC output signal 125-*m* corresponding to that RX lane 100-*m*, and provided to the corresponding TP monitor 120-*m*. The combined ADC output signal 125-*m* may include the plurality of ADC output signals 105-*m*-0, . . . , 105-*m*-*n* in each RX lane (e.g., RX lane 100-*m*).

Referring to FIG. 1A and FIG. 1B, the plurality of TP monitors 120-0, . . . , 120-*m* may be any circuit or hardware or one or more microprocessors that are configured to measure or monitor timing and performance of the corresponding RX lanes 100-0, . . . , 100-*m*. The CM processor 122-*m* of each TP monitor (e.g., TP monitor 120-*m*) may generate, based on the combined conversion monitoring (CM) signal 121-*m*, one or more timing bits 132-*m* (corresponding to the RX lane 100-*m*). In some embodiments, the one or more timing bits 132-*m* may include the plurality of CM bits (e.g., CM<0> 104-*m*-0, CM<1> 104-*m*-1, . . . , CM<n> 104-*m*-*n*) contained in the combined CM signal 121-*m*. In some embodiments, the one or more timing bits 132-*m* may indicate the number of 1's in the plurality of CM bits contained in the combined CM signal. In some embodiments, the one or more timing bits 132-*m* may be set such that the greater value the timing bits 132-*m* indicate, the more power the corresponding RX lane 100-*m* has consumed and/or the more noise the corresponding RX lane 100-*m* has produced.

Referring to FIG. 1B, the BER detector 124-*m* of each TP monitor (e.g., TP monitor 120-*m*) may generate, based on the combined ADC output signal 125-*m*, one or more BER bits 134-*m* (corresponding to the RX lane 100-*m*). The BER detector 124-*m* may calculate a BER (corresponding to the RX lane 100-*m*) using the combined ADC output signal 125-*m* and an input signal of pseudo-random bit sequences (PRBSs), and set the one or more BER bits 134-*m* based on the calculate BER. In some embodiments, the one or more BER bits 134-*m* may indicate the calculated BER (corresponding to the RX lane 100-*m*). In some embodiments, the one or more BER bits 134-*m* may be set such that the greater value the BER bits 134-*m* indicate, the more noise the corresponding RX lane 100-*m* has produced.

Referring to FIG. 1B, the SNR calculator 126-*m* of each TP monitor (e.g., TP monitor 120-*m*) may generate, based on the combined ADC output signal 125-*m*, one or more SNR bits 136-*m* (corresponding to the RX lane 100-*m*). The SNR detector 126-*m* may calculate an SNR (corresponding to the RX lane 100-*m*) after performing equalization of the combined ADC output signal 100-*m*, and set the one or more SNR bits 136-*m* based on the calculate SNR. In some embodiments, the one or more SNR bits 136-*m* may indicate the calculated SNR (corresponding to the RX lane 100-*m*). In some embodiments, the one or more SNR bits 136-*m* may be set such that the greater value the SNR bits 136-*m* indicate, the more noise the corresponding RX lane 100-*m* has produced. Each TP monitor (e.g., TP monitor 120-*m*) may combine the one or more timing bits 132-*m*, the one or more BER bits 134-*m*, and/or the one or more SNR bits 136-*m* to provide a set of TP bits 141-*m* (corresponding to the RX lane 100-*m*) to the AVS controller 140.

Referring to FIG. 1A and FIG. 1C, the plurality of process monitors 160-0, . . . , 160-*k* may be any be any circuit or hardware or one or more microprocessors that are configured to measure or monitor process variation of one or more circuits. For example, each process monitor (e.g., process monitor 160-*k*) may measure or monitor at least one of delay (e.g., delay measured by an oscillation frequency of a standard cell-based ring oscillator), leakage current, resistance, or capacitance of one or more circuits under the same power domain (e.g., under the same AVDD power domain). Each process monitor (e.g., process monitor 160-*k*) may combine results of the measurements or the monitoring to provide a set of PM bits 145-*k* to the AVS controller 140.

Referring to FIG. 1C, each process monitor (e.g., process monitor 160-*k*) may include a frequency monitor 161-*k* (or frequency monitoring circuit), a leakage monitor 162-*k* (or leakage monitoring circuit), and/or a metal resistance and capacitance (RC) monitor 163-*k* (or metal RC monitoring circuit). The frequency monitor 161-*k* may measure various types of standard cell delay. The leakage monitor 162-*k* may measure leakage current of one or more transistors (e.g., NMOS, PMOS). The metal RC monitor 163-*k* may monitor or measure resistance and/or capacitance of designed metal patterns (e.g., metal, wiring, via, etc.). Each process monitor (e.g., process monitor 160-*k*) may generate, based on outputs of the frequency monitor 161-*k*, the leakage monitor 162-*k* and/or the metal RC monitor 163-*k*, a combined process monitoring (PM) signal 145-*k*, and provide the combined PM signal 145-*k* to the AVS controller 140. The combined PM signal may be a digital signal with a plurality of bits (e.g., (N+1) bits where Nis a non-negative integer). The combined PM signal 145-*k* may include one or more frequency monitor (FM) bits 172-*k*, one or more leakage monitor (LM) bits 174-*k*, and/or one or more metal resistance and capacitance monitor (MRC) bits 176-*k*.

Referring to FIG. 1C, the one or more FM bits 172-*k* (among the set of PM bits 145-*k*) may indicate a delay of one or more circuits. In some embodiments, the one or more FM bits 172-*k* may be set such that the greater value the FM bits 172-*k* indicate, the more power the one or more circuits have consumed and/or the more noise the one or more circuits have produced. In some embodiments, the one or more LM bits 174-k (among the set of PM bits 145-k) may indicate an amount of leakage current of one or more circuits. In some embodiments, the one or more LM bits 174-k may be set such that the greater value the LM bits 174-k indicate, the more power the one or more circuits have consumed and/or the more noise the one or more circuits have produced. In some embodiments, the one or more MRC bits 176-k (among the set of PM bits 145-k) may indicate a value of resistance/capacitance (RC) of one or more metal patterns. In some embodiments, the one or more MRC bits 176-k may be set such that the greater value the MRC bits 176-k indicate, the more power the one or more circuits have consumed and/or the more noise the one or more circuits have produced.

Referring back to FIG. 1A, the AVS controller 140 may be any circuit or hardware or one or more microprocessors that are configured to control and/or perform AVS operations. The regulator controller 142 of the AVS controller 140 may generate, based on the plurality of sets of TP bits 141-0, 141-1, ..., 141-m and/or the plurality of sets of PM bits 145-0, 145-1, ..., 145-k, one or more voltage regulator (VR) control bits 151, and provide the generated one or more VR control bits 151 to the voltage regulator 150. The voltage regulator 150 may control a supply voltage (e.g., AVDD 152) based on the one or more VR control bits 151. The analog performance tuner 144 of the AVS controller 140 may generate, based on the plurality of sets of TP bits 141-0, 141-1, ..., 141-m and/or the plurality of sets of PM bits 145-0, 145-1, ..., 145-k, one or more analog control bits 147, and provide the generated one or more analog control bits 147 to the plurality of RX lanes 100-0, 100-1, ..., 100-m (and ADCs therein). The ADCs in the plurality of RX lanes 100-0, 100-1, ..., 100-m may tune or adjust analog design parameters based on the one or more analog control bits 147. The analog design parameters may include, but not limited to, comparator bias current, input common mode voltage, programmable delay, etc.

Referring to FIG. 1A, the voltage regulator 150 may be any circuit or hardware that is configured to generate and/or regulate a supply voltage (e.g., AVDD 152) such that the supply voltage 152 is maintained constant, and provide the regulated supply voltage 152 to a plurality of circuits including the plurality of process monitors 160-0, 160-1, ..., 160-k and the plurality of RX lanes 100-0, 100-1, ..., 100-m. The voltage regulator 150 may generate, based on the VR control bits 151, an AVDD 152, and provide the generated AVDD 152 to the plurality of circuits.

Figure 2A:
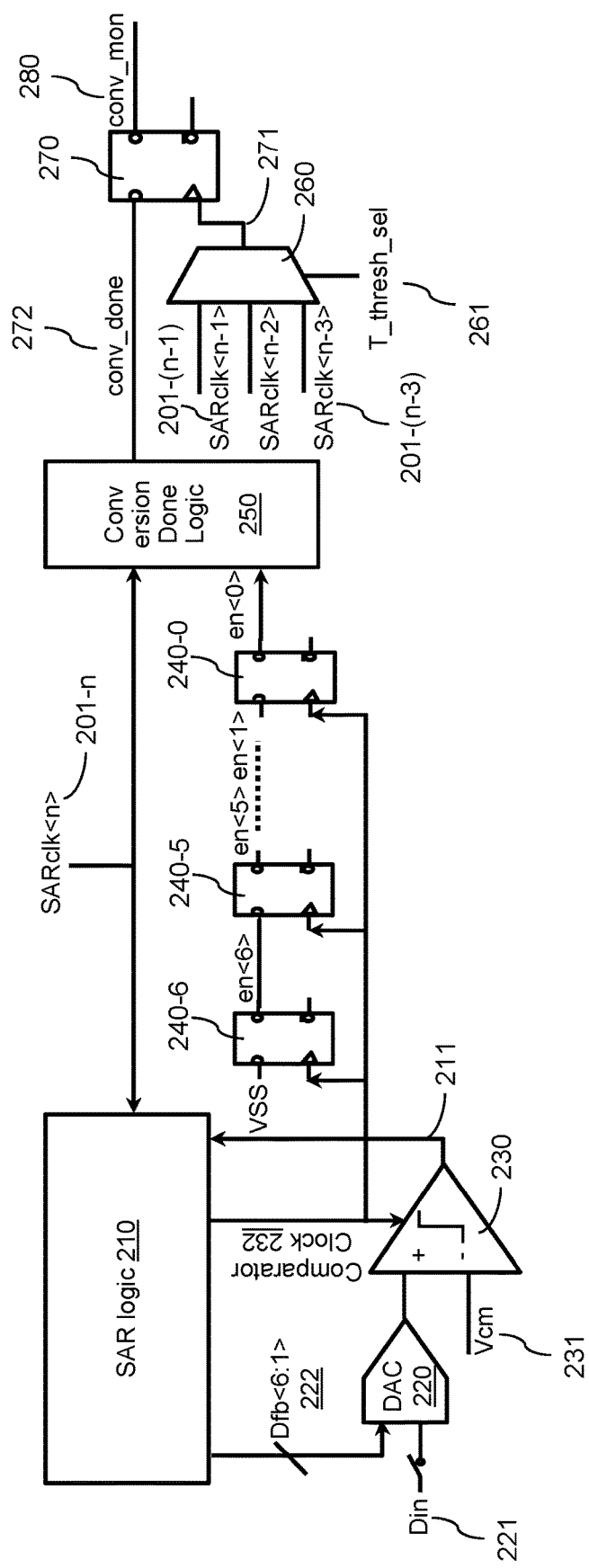
FIG. 2A is a diagram of an example conversion monitor for measuring a speed of an ADC, in accordance with an embodiment.

FIG. 2A is a diagram of an example conversion monitor 2000 for measuring a speed of an ADC, in accordance with an embodiment. In some embodiments, each of the conversion monitor (e.g., conversion monitor 103-m-0, ..., 103-m-n) in each RX lane (e.g., 100-m) may have configuration similar to that of the conversion monitor 2000. The conversion (timing) monitor 2000 of a SAR ADC may include a DAC 220, a SAR logic circuit 210, a comparator 230 (or comparator circuit), a plurality of shift registers 240-0, ..., 240-6 that are serially connected, a conversion done logic 250 (or conversion done logic circuit), a multiplexer 260, and an output register 270 configured to output a signal 280 representing a CM bit. The DAC 220 may be a capacitive DAC (CDAC) or any DAC that can convert a digital signal (Dfb<6:1> 222) to an analog signal responsive to a data input signal Din 221. The comparator 230 may be a differential amplifier, e.g., operational amplifier. The comparator 230 may receive the analog signal output from the DAC and an input analog signal Vcm 230, compare the two signals, and output a signal 211 indicating a result of the comparison. The SAR logic circuit 210 may be configured to receive a sampling clock (SARclk<n> 210-n) of an $n^{th}$ unit SAR ADC (e.g., ADC<n> 102-m-n in FIG. 1B), sequentially determine a value of each digital bit of the digital signal (e.g., 6 bits digital signal 222) based on the output signal 221 of the comparator 230, and provide a clock 232 (e.g., asynchronous clock) to the comparator 230. The plurality of shift registers 240-0, ..., 240-6 may count the number of conversion steps (e.g., 7 steps). The conversion done logic 250 may receive the sampling clock 210-n and an output from the last shift register 240-0, and output a conversion done signal 272 which indicates whether the conversion of the input analog signal 231 completes.

Referring to FIG. 2A, the SAR logic circuit 210 may be an asynchronous SAR logic circuit that does not use an internal clock while still using a sample clock (e.g., sampling clock 201-n) for uniform sampling of the analog signal 231. With the asynchronous SAR logic, the execution time for each of conversion steps of a conversion may not be fixed and/or uniform. Instead, after each of the conversion steps completes, the next step in the conversion can begin without a substantial delay in between.

Referring to FIG. 2A, the multiplexer 260 may receive a plurality of sampling clocks (e.g., SARclk<n-1> 201-(n-1), SARclk<n-2> 201-(n-2), SARclk<n-3> 201-(n-3)) of other ADC units (e.g., $(n-1)^{th}$ ADC unit, $(n-2)^{th}$ ADC unit, $(n-3)^{th}$ ADC unit), and output a threshold signal 271 indicating a threshold interval, according to a selection signal (T_thresh_sel 261). The threshold interval may be defined as a clock interval between two (selected) unit ADCs. The threshold interval may be programmable by choosing among different clock phases. If the selection signal indicates two sampling clocks (e.g., sampling clocks 201-(n-1) and 201-(n-2)) out of the plurality of sampling clocks, the multiplexer 260 may output a threshold signal 271 indicating a threshold interval that is a clock interval between the two sampling clocks 201-(n-1) and 201-(n-2). The output register 270 may receive a conversion done signal 272 from the conversion done logic 270 and a threshold signal 271 from the multiplexer 260, and output a signal 280 representing a CM bit.

A margin of time between when a conversion of a sample of an analog signal completes and a next sample of the analog signal is taken (e.g. tracked and held) can be referred to as the "conversion time margin" or "conversion margin." The conversion margin can be a measure of performance of a SAR ADC (e.g., asynchronous SAR ADC) in terms of speed. For example, a SAR conversion margin may be a good indicator for the SAR ADC conversion speed compared to design specifications (or targets). In general, the existence or long period of a conversion margin indicates that an asynchronous SAR ADC is overperforming in terms of conversion speed and, as a result, consuming more power and/or producing more noise than necessary.

Figure 2B:
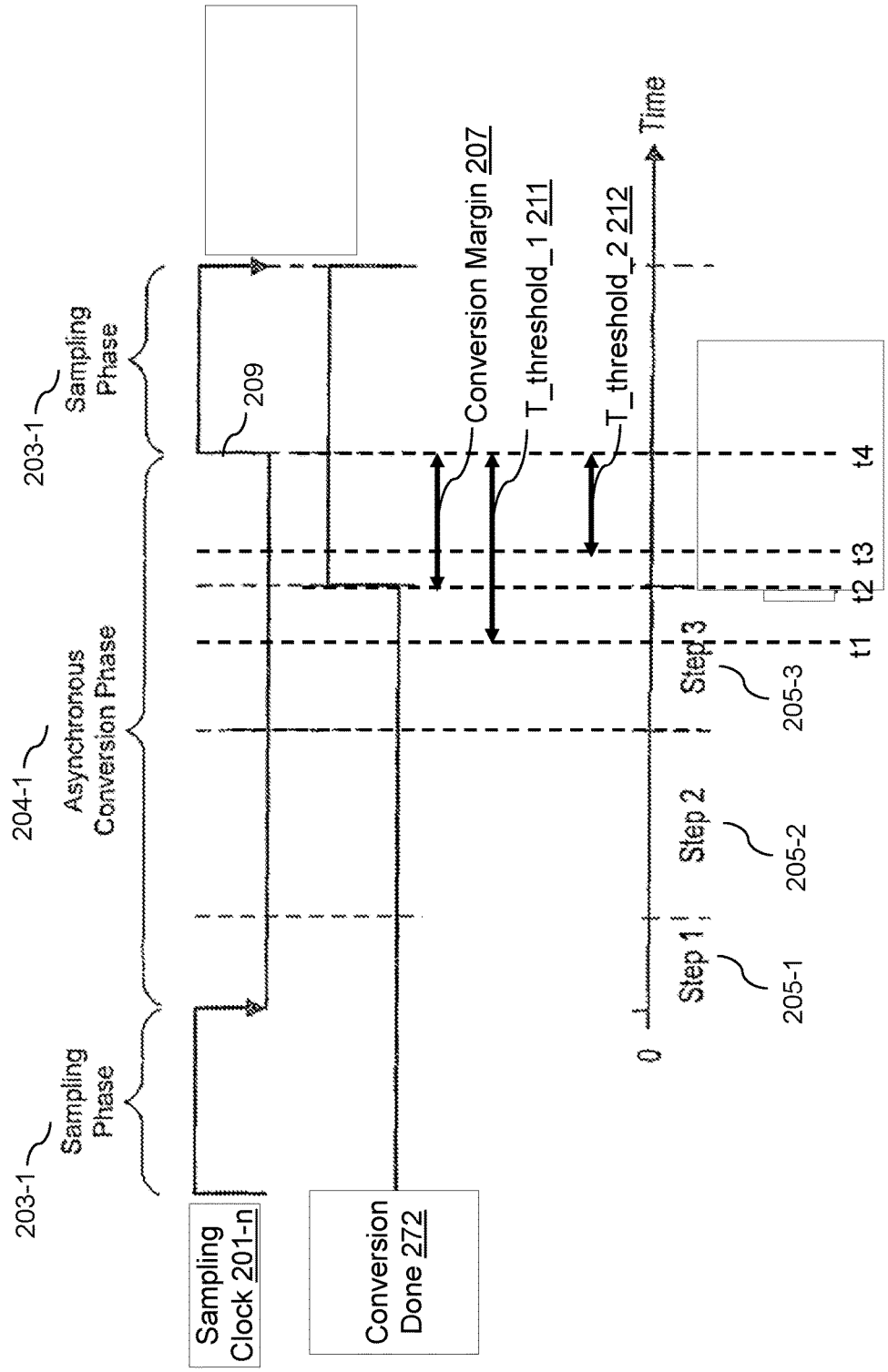
FIG. 2B is a timing diagram for measuring a speed of an ADC, in accordance with an embodiment.

FIG. 2B is a timing diagram 2500 for measuring a speed of an ADC, in accordance with an embodiment. Referring to FIG. 2A and FIG. 2B, a conversion margin 207 may be determined based on the conversion done signal 272 and the next sampling clock 209. In some embodiments, the output register 270 may set the CM bit 280 to "1" when the conversion margin 207 is greater than a threshold interval (e.g., T_threshold_2 212), and set the CM bit 280 to "0" when the conversion margin is smaller than or equal to a threshold interval (e.g., T_threshold_1 211). For example, in the timing diagram 2500, after an analog signal is sampled in a sampling phase 203-1, a process of conversion steps 205-1, 205-2, 205-3, ... may be performed asynchronously (in an asynchronous conversion phase 204-1). Responsive to completion of the conversion process, the conversion done signal 272 may be "on" (e.g., switched to a high level) at time t2, which defines a conversion margin 272 (or conversion time margin) between the time t2 when the conversion done signal becomes "on" and the start of the next sampling phase 203-1 at t4. If the conversion margin 207 is smaller than a threshold interval (e.g., threshold interval 211), the multiplexer 260 may output a threshold signal at time t1 before the conversion done signal 272 is on, and the output register 270 may set the CM bit 280 to "0". On the other hand, if the conversion margin 207 is greater than a threshold interval (e.g., threshold interval 212), the multiplexer may output a threshold signal at t3 after the conversion done signal is on, and the output register 270 may set the CM bit 280 to "1". For best characterization of the ADC speed of an integrated circuit (e.g., the speed of SAR ADCs in the whole switch chip), CM bits (calculated by the respective conversion monitors) may be collected by obtaining multiple samples from each unit ADC (e.g., unit SAR ADC) across all the RX lanes 100-0, . . . , 100-m. In this manner, the AVS system can capture (1) data-dependent delay variation and/or (2) local or global process variability-induced delay variation.

Figure 3:
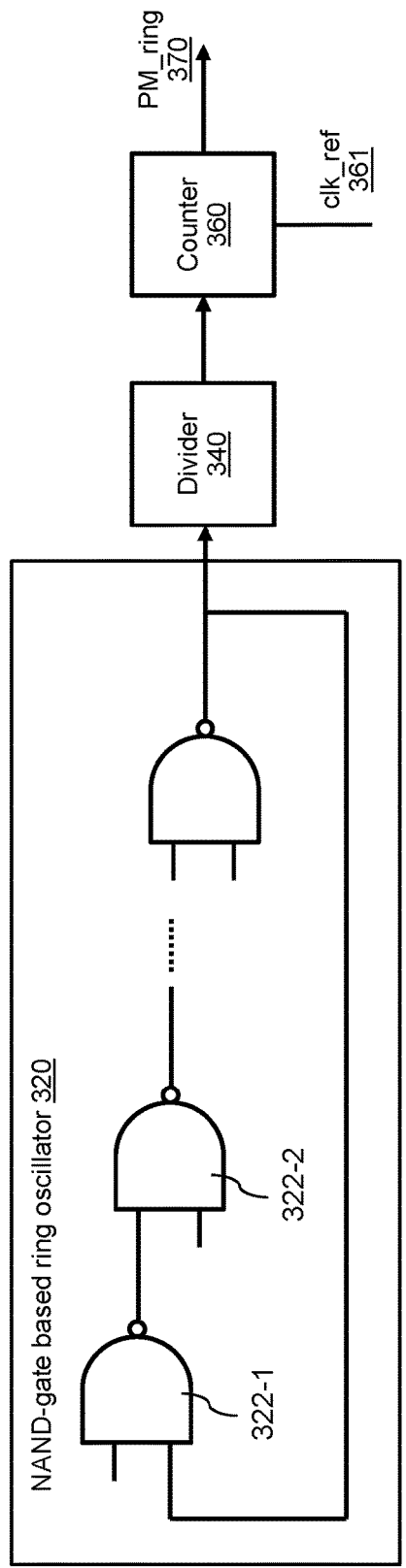
FIG. 3 is a diagram of an example ring oscillator frequency monitor for measuring a standard cell delay of a ring oscillator, in accordance with an embodiment.

FIG. 3 is a diagram of an example ring oscillator frequency monitor 3000 for measuring a standard cell delay of a ring oscillator 320, in accordance with an embodiment. In some embodiments, the frequency monitor (e.g., frequency monitor 161-k) in each process monitor (e.g., process monitor 160-0, 160-1, . . . , 160-k) may have configuration similar to that of the frequency monitor 3000. The frequency monitor 3000 (or frequency monitoring circuit) may include a NAND-gate based ring oscillator 320, a divider 340 (or divider circuit), and/or a counter 360 (or counter circuit). The ring oscillator 320 may include a plurality of NAND gates 322-1, 322-2, . . . (e.g., an odd number of NAND gates). The frequency monitor 3000 may measure a delay of selected one or more standard cells under an analog power supply (e.g., AVDD 152 in FIG. 1A). The ring oscillator 320 may be implemented with one or more standard cells that are selected or chosen to match the delay of a critical path in ADCs (for example, a critical path including digital elements inside a SAR ADC). The divider 340 may divide a clock output from the ring oscillator to relax a timing requirement for the counter 360. The counter 360 may receive the divided clock output from the divider 340, calculate (or count) an oscillation frequency value 370 based on the divided clock according a reference clock 361, and store the oscillation frequency value 370 in a register (not shown). For example, the divider 340 may divide the ring oscillator output clock into a low frequency clock. The counter 360 may be driven by the reference clock and sample the incoming divided clock. The frequency of the reference clock 361 is higher than the frequency of the divided clock. The lower frequency of the divided clock helps to reduce the frequency of the reference clock 361 so that the timing requirement for a sequential logic path is relaxed with the lower frequency clock.

Figure 4:
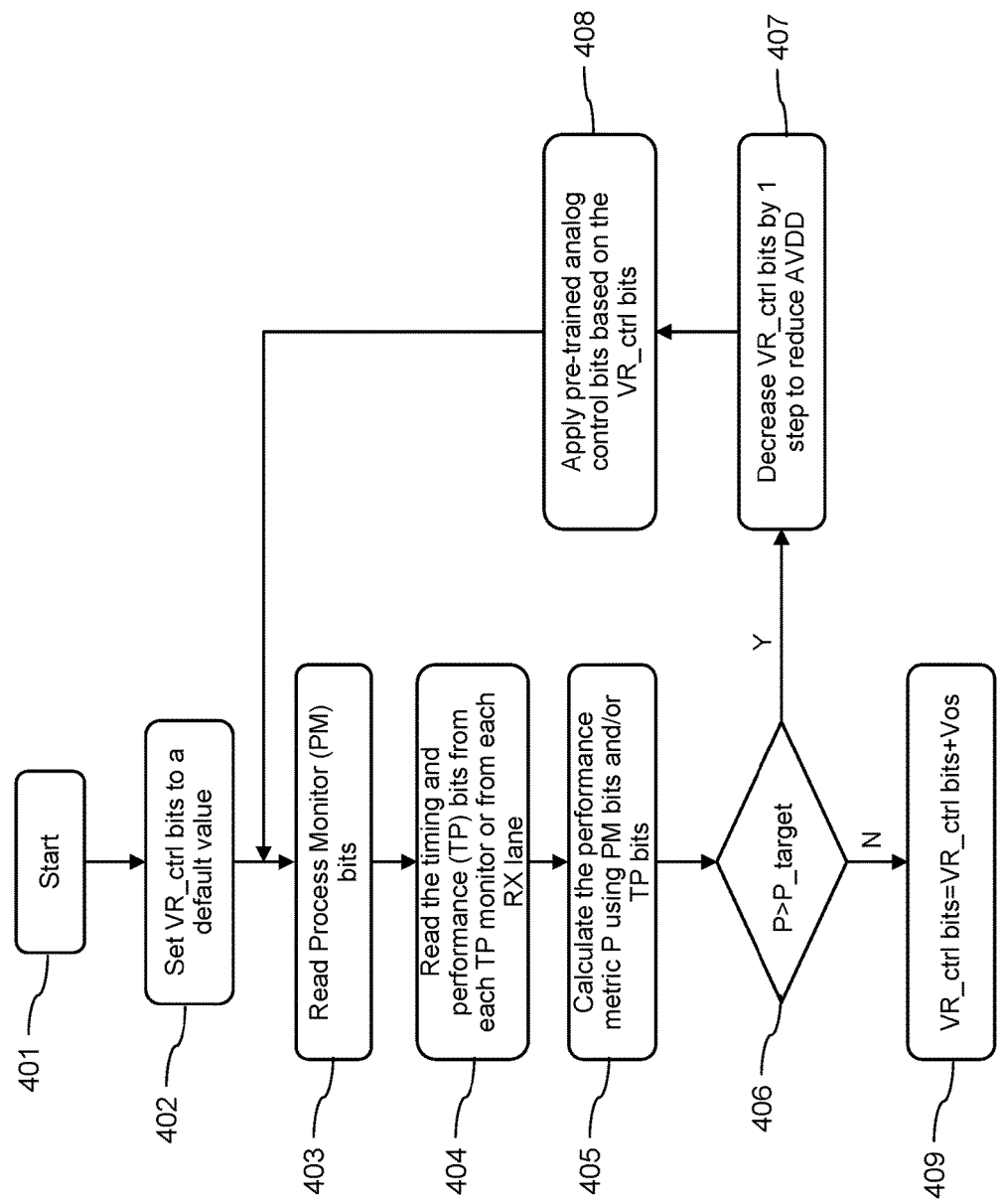
FIG. 4 is a flow diagram showing an example process of performing AVS operations for ADCs, in accordance with an embodiment.

FIG. 4 is a flow diagram showing an example process 4000 of performing AVS operations for ADCs, in accordance with an embodiment. An AVS system (e.g., AVS system 1000 in FIG. 1) may perform a process of AVS operations for multiple lanes of ADCs in an integrated circuit (e.g., multiple SerDes lanes 100-0, . . . , 100-m of SAR ADCs in a switch chip 1001 in FIG. 1A). In some embodiments, the AVS system can run the process 4000 of AVS operations in foreground and/or background. For example, a foreground calibration is a one-time calibration with specific input training sequences. In the foreground calibration, it is difficult to process a normal data flow. A background calibration is a continuous calibration running together with a normal data flow. In some embodiments, monitors (e.g., TP monitors 120, process monitors 160, conversion monitors 103, frequency monitors 161, leakage monitors 162, metal RC monitors 163, etc.) can run in both background mode and foreground mode.

At step 401, the AVS system (e.g., AVS system 1000, AVS controller 140, voltage regulator 150) may start AVS operations. At step 402, the voltage regulator 150 may set or initialize a supply voltage (e.g., AVDD 162) to a default voltage without voltage scaling. The regulator controller 142 of the AVS controller 140 may set the one or more VR control bits 151 to "0" or any default value, and provide the VR control bits 151 to the voltage regulator 150 so that the voltage regulator 150 can set the AVDD 152 to the default voltage.

At step 403, the AVS controller 140 may collect process information (e.g., the plurality of sets of PM bits 145). The AVS controller may read, obtain, collect, or receive a set of PM bits (e.g., PM bits 145-k) from each process monitor (e.g., process monitor 160-k). At step 404, the AVS controller 140 may collect timing and performance (TP) information (e.g., the plurality of sets of TP bits 141). The AVS controller 140 may read, obtain, collect, or receive a set of TP bits (e.g., TP bits 141-m) from each TP monitor (e.g., TP monitor 120-m) or from each RX lane (e.g., RX lane 100-m).

At step 405, the AVS controller 140 may calculate a performance metric P (e.g., SAR ADC performance metric) based on the process information (e.g., the plurality of sets of PM bits 145) and/or the TP information (e.g., the plurality of sets of TP bits 141). The performance metric P may be calculated based on one or more values indicated in the plurality of sets of PM bits 145 and/or one or more values indicated in the plurality of sets of TP bits 141. In some embodiments, the performance metric P may be calculated based on (1) values indicated by timing bits of the plurality of sets of TP bits (e.g., timing bits 132-m in TP bits 141-m), (2) values indicated by BER bits of the plurality of sets of TP bits (e.g., BER bits 134-m in TP bits 141-m), (3) values indicated by SNR bits of the plurality of sets of TP bits (e.g., SNR bits 136-m in TP bits 141-m), (4) values indicated by FM bits of the plurality of sets of PM bits (e.g., FM bits 172-k in PM bits 145-k), (5) values indicated by LM bits of the plurality of sets of PM bits (e.g., LM bits 174-k in PM bits 145-k), and/or (6) values indicated by MRC bits of the plurality of sets of PM bits (e.g., MRC bits 176-k in PM bits 145-k). In some embodiments, the performance metric P may be calculated based on a sum (e.g., weighted sum) of (1) values indicated by timing bits of the plurality of sets of TP bits (e.g., timing bits 132-m in TP bits 141-m), (2) values indicated by BER bits of the plurality of sets of TP bits (e.g., BER bits 134-m in TP bits 141-m), (3) values indicated by SNR bits of the plurality of sets of TP bits (e.g., SNR bits 136-m in TP bits 141-m), (4) values indicated by FM bits of the plurality of sets of PM bits (e.g., FM bits 172-k in PM bits 145-k), (5) values indicated by LM bits of the plurality of sets of PM bits (e.g., LM bits 174-k in PM bits 145-k), and/or (6) values indicated by MRC bits of the plurality of sets of PM bits (e.g., MRC bits 176-k in PM bits 145-k). The performance metric P may be calculated such that the greater the calculated performance metric P is, the more power the plurality of RX lanes 100 or the integrated circuit 1001 has consumed and/or the more noise the plurality of RX lanes 100 or the integrated circuit 1001 has produced.

At step 406, the AVS controller 140 may compare the calculated performance metric P with a target performance metric $P_{target}$. The target performance metric $P_{target}$ may be experimentally (or by simulations) determined to indicate that power and/or noise that the plurality of RX lanes 100 or the integrated circuit 1000 consume and/or produce satisfy predetermined design specifications (or targets).

At step 407, responsive to determining that the calculated performance metric P is greater than the target performance metric $P_{target}$, the AVS controller 140 may reduce or scale down the AVDD 152 by decreasing the value of the one or more VR control bits 151 and providing the decreased value to the voltage regulator 150. In some embodiments, the AVS controller 140 may decrease or reduce the value of the one or more VR control bits 151 by a predetermined step value (e.g., 1).

At step 408, the AVS controller 140 (e.g., analog performance tuner 144) may determine, tune, or adjust the one or more analog control bits 147 based on the one or more VR control bits 151 calculated at step 407 (or the AVDD 152 corresponding to the VR control bits 151). In some embodiments, the AVS controller 149 may apply pre-trained or pre-determined analog control bits to the ADCs in the plurality of RX lanes, based on the one or more VR control bits 151 calculated at step 407. For example, the AVS controller 140 may refer to a lookup table (LUT) (not shown) stored in a memory (not shown) and find, in the LUT, a value of analog control bits corresponding to the value of the one or more VR control bits 151 (or the AVDD 152 corresponding to the VR control bits 151). Then, the iteration may continue by going back to step 403.

At step 409, responsive to determining that the calculated performance metric P is smaller than or equal to the target performance metric $P_{target}$ (or the calculated performance metric P reaches the target performance metric $P_{target}$), the AVS controller 140 may increase or scale up the AVDD 152 by increasing the value of the one or more VR control bits 151 and providing the increased value to the voltage regulator 150. In some embodiments, the AVS controller 140 may increase (or back off) the value of the one or more VR control bits 151 by a predetermined value (or an offset; e.g., a predetermined voltage value Vos) so as to leave a margin for temperature drift and/or device aging.

FIG. 5 is a flow diagram showing another example process 5000 of performing AVS operations for ADCs, in accordance with an embodiment. In some embodiments, the process 5000 is performed by a system (e.g., RX lanes 100, ADCs 102-1, . . . , 102-$m$) or a controller (e.g. AVS controller 140), or circuitry (e.g. a plurality of process monitors 160, timing and performance monitor 120). The controller may provide a voltage to a plurality of ADCs (e.g., ADCs 102-1, . . . , 102-$m$). In other embodiments, the process 5000 is performed by other entities. In some embodiments, the process 5000 includes more, fewer, or different steps than shown in FIG. 5.

At step 502, the controller (e.g., TP monitor 120-0, . . . , 120-$m$, and/or AVS controller 140) may receive a plurality of signals (e.g., CM bits 105-$m$-0, . . . , 105-$m$-$n$, or the plurality of sets of TP bits 141-1, . . . , 141-$m$) each indicating characteristics of performance of a corresponding ADC of the plurality of ADCs (e.g., ADC 102-$m$-0, . . . , 102-$m$-$n$ in RX lane 100-$m$). In some embodiments, before receiving the plurality of signals, the controller (e.g., AVS controller 140) may set the voltage (e.g., AVDD 152) to a first voltage (e.g., default value), and a voltage regulator (e.g., voltage regulator 150) may provide the first voltage to the plurality of ADCs (e.g., ADC 102-$m$-0, . . . , 102-$m$-$n$ in RX lane 100-$m$).

In some embodiments, a time relating to an analog-to-digital conversion by each ADC of the plurality of ADCs (e.g., conversion margin 207) may be measured. The measured time (e.g., conversion margin 207) may be compared with a second threshold (e.g., threshold interval 211 or threshold interval 212). The plurality of signals (e.g., CM bits 105-$m$-0, . . . , 105-$m$-$n$) may be generated based at least on a result of the comparing.

At step 504, the controller (e.g., AVS controller 140) may determine, based at least on the plurality of signals (e.g., CM bits 105-$m$-0, . . . , 105-$m$-$n$), a metric indicating performance of the plurality of ADCs (e.g., performance metric P). At step 506, the controller may compare the metric with a threshold (e.g., target performance metric $P_{target}$).

At step 508, in response to determining that the metric (e.g., performance metric P) is greater than the threshold (e.g., target performance metric $P_{target}$), the controller (e.g., AVS controller 140) may reduce the voltage by a factor (e.g., predetermined factor, predetermined portion, predetermined percentage, predetermined step value, or predetermined voltage value). For example, the AVS controller 140 may decrease the value of the one or more VR control bits 151 and provide the decreased value to the voltage regulator 150. The AVS controller 140 may decrease or reduce the value of the one or more VR control bits 151 by a predetermined step value (e.g., 1) so that the voltage regulator 150 can reduce the AVDD by a predetermined voltage value. After reducing the voltage by the factor, the voltage regulator 150 may provide the reduced voltage (e.g., AVDD) to the plurality of ADCs (e.g., plurality of ADCs in each RX lane 100-0, . . . , 100-$m$). In some embodiments, in response to determining that the metric is smaller than or equal to the threshold, the controller (e.g., AVS controller 140) may increase the voltage by an offset (e.g., a predetermined voltage value Vos).

In some embodiments, after reducing the voltage by the factor at step 508, a second metric indicating performance of the plurality of ADCs (e.g., comparator bias current, input common mode voltage, programmable delay, etc.) may be adjusted based on the reduced voltage (e.g., based on the reduced AVDD or based on the one or more VR control bits 151). The second metric may be different from the metric (e.g., performance metric P). In some embodiments, after reducing the voltage by the factor, a second plurality of signals (e.g., one or more analog control bits 147) each indicating characteristics of performance of a corresponding ADC of the plurality of ADCs may be received.

In some embodiments, the voltage regulator 150 may provide the voltage AVDD to one or more circuits. At least one of standard cell delay, leakage current, or resistance and capacitance of metal patterns may be measured from one or more circuits. One or more signals corresponding to the one or more circuits (e.g., set of PM bits 145-$k$ including FM bits 172-$k$, LM bits 174-$k$, MRC bits 176-$k$) may be generated based on a result of the measuring (e.g., measuring by a process monitor 160-$k$ including frequency monitor 161-$k$, leakage monitor 162-$k$, metal RC monitor 163-$k$). The metric (e.g., performance metric P) may be determined based on the plurality of signals (e.g., the plurality of sets of TP bits 141-0, . . . , 141-$m$) and the one or more signals (e.g., the plurality of sets of PM bits 145-0, . . . , 145-$k$).

The term "coupled" and variations thereof includes the joining of two members directly or indirectly to one another. The term "electrically coupled" and variations thereof includes the joining of two members directly or indirectly to one another through conductive materials (e.g., metal or copper traces). Such joining (for both terms "coupled" and "electrically coupled") may be stationary (e.g., permanent or fixed) or moveable (e.g., removable or releasable). Such joining (for both terms "coupled" and "electrically coupled") may be achieved with the two members coupled directly with or to each other, with the two members coupled with each other using a separate intervening member and any additional intermediate members coupled with one another, or with the two members coupled with each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

It should be noted that certain passages of this disclosure can reference terms such as "first" and "second" in connection with subsets of transmit spatial streams, sounding frames, response, and devices, for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities that can operate within a system or environment. It should be understood that the systems described above can provide multiple ones of any or each of those components and these components can be provided on either a stand-alone machine or, in some embodiments, on multiple machines in a distributed system. In addition, the systems and methods described above can be provided as one or more computer-readable programs or executable instructions embodied on or in one or more articles of manufacture, e.g., a floppy disk, a hard disk, a CD-ROM, a flash memory card, a PROM, a RAM, a ROM, or a magnetic tape. The programs can be implemented in any programming language, such as LISP, PERL, C, C++, C#, or in any byte code language such as JAVA. The software programs or executable instructions can be stored on or in one or more articles of manufacture as object code. In some embodiments, the ADC is employed as an integrated circuit in a transmitter for wireless communication. The ADC is provided on an integrated circuit that includes the calibration engine. The ADC and calibration engine are provided in a single chip or multichip integrated package in some embodiments.

While the foregoing written description of the methods and systems enables one of ordinary skill to make and use embodiments thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

What is claimed is:

1. A system comprising:
one or more receivers each including a plurality of analog-to-digital converters (ADCs), each ADC being configured to:
measure a time relating to an analog-to-digital conversion by the ADC;
compare the time with a threshold comprising a duration; and
generate, based on whether the time is greater than the duration, a first signal;
a circuitry coupled to the one or more receivers and configured to:
receive the first signal from each ADC;
determine, based at least on the first signal, characteristics of performance of each receiver; and
output a plurality of second signals, each indicating the characteristics of performance of a corresponding receiver; and
a controller coupled to the circuitry and configured to:
adjust a voltage provided to the one or more receivers, based at least on the plurality of second signals received from the circuitry.

2. The system of claim 1, wherein each receiver is a serializer/deserializer (SerDes) receiver.

3. The system of claim 1, wherein the plurality of ADCs in each receiver include time-interleaved successive approximation register (SAR) ADCs.

4. The system of claim 3, wherein the threshold is a clock interval between two SAR ADCs.

5. The system of claim 1, wherein the characteristics of performance of each receiver include at least one of conversion timing of ADCs in the receiver, signal-to-noise ratio (SNR), or bit-error-rate (BER).

6. The system of claim 1, wherein
the voltage is provided to one or more circuits, and
the system further comprises second circuitry coupled to the one or more circuits and configured to:
measure, from the one or more circuits, at least one of standard cell delay, leakage current, or resistance and capacitance of metal patterns; and
output, based on a result of the measuring, one or more third signals corresponding to the one or more circuits.

7. The system of claim 6, wherein the controller is further configured to adjust the voltage provided to the one or more receivers, based at least on the plurality of second signals and the one or more third signals.

8. A method comprising:
receiving, by a controller providing a voltage to a plurality of analog-to-digital converters (ADCs), a plurality of signals each indicating characteristics of performance of a corresponding ADC of the plurality of ADCs;
determining, by the controller based at least on the plurality of signals, a metric indicating performance of the plurality of ADCs;
comparing, by the controller, the metric with a threshold;
in response to determining that the metric is greater than the threshold, reducing, by the controller, the voltage by a factor;
measuring a time relating to an analog-to-digital conversion by each ADC of the plurality of ADCs;
comparing the measured time with a second threshold comprising a duration; and generating, based at least on whether the time is greater than the duration, the plurality of signals.

9. The method of claim 8, further comprising:
in response to determining that the metric is smaller than or equal to the threshold, increasing, by the controller, the voltage by an offset.

10. The method of claim 8, further comprising:
before receiving the plurality of signals, setting the voltage to a first voltage and providing, by a voltage regulator, the first voltage to the plurality of ADCs; and
after reducing the voltage by the factor, providing, by the voltage regulator, the reduced voltage to the plurality of ADCs.

11. The method of claim 8, further comprising:
after reducing the voltage by the factor, receiving a second plurality of signals each indicating characteristics of performance of a corresponding ADC of the plurality of ADCs.

12. The method of claim 8, further comprising:
providing the voltage to one or more circuits;
measuring, from the one or more circuits, at least one of standard cell delay, leakage current, or resistance and capacitance of metal patterns; and
generating, based on a result of the measuring, one or more signals corresponding to the one or more circuits, and
determining the metric based on the plurality of signals and the one or more signals.

13. The method of claim 8, further comprising:
after reducing the voltage by the factor, adjusting, based on the reduced voltage, a second metric indicating performance of the plurality of ADCs, the second metric being different from the metric.

14. Circuitry comprising:
a first circuit coupled to a plurality of analog-to-digital converters (ADCs) and configured to:
measure a time relating to an analog-to-digital conversion by each ADC of the plurality of ADCs;
compare the measured time with a threshold comprising a duration; and
generate, based at least on whether the time is greater than the duration, a plurality of first signals corresponding to the plurality of ADCs;
determine, based at least on the plurality of first signals, characteristics of performance of the plurality of ADCs; and
output a second signal indicating the characteristics of performance of the plurality of ADCs; and
a second circuit coupled to the first circuit and configured to:
adjust a voltage provided to the plurality of ADCs, based at least on the second signal received from the first circuit.

15. The circuitry of claim 14, wherein the plurality of ADCs include time-interleaved successive approximation register (SAR) ADCs.

16. The circuitry of claim 15, wherein the threshold is a clock interval between two SAR ADCs.

17. The circuitry of claim 14, wherein
the plurality of ADCs form a receiver, and
the characteristics of performance include at least one of conversion timing of the plurality of ADCs in the receiver, signal-to-noise ratio (SNR) of the receiver, or bit-error-rate (BER) of the receiver.

18. The circuitry of claim 14, wherein
the voltage is provided to one or more circuits, and
the circuitry further comprises a third circuit coupled to the one or more circuits and configured to
measure, from the one or more circuits, at least one of standard cell delay, leakage current, or resistance and capacitance of metal patterns; and
output, based on a result of the measuring, one or more third signals corresponding to the one or more circuits.

19. The circuitry of claim 18, wherein the second circuit is further configured to adjust the voltage provided to the plurality of ADCs, based at least on the second signal and the one or more third signals.

* * * * *